United States Patent [19]

Cook

[11] Patent Number: 5,311,163

[45] Date of Patent: May 10, 1994

[54] ELECTRICALLY OPERATED MAGNETIC SWITCH DESIGNED TO DISPLAY REDUCED LEAKAGE INDUCTANCE

[75] Inventor: Edward G. Cook, Livermore, Calif.

[73] Assignee: The United States of America as represented by the United States Department of Energy, Washington, D.C.

[21] Appl. No.: 911,190

[22] Filed: Sep. 22, 1986

[51] Int. Cl.$^5$ .............................................. H02M 7/06
[52] U.S. Cl. ...................................................... 336/222
[58] Field of Search ...................... 336/222, 200, 186; 335/299, 282

[56] References Cited

U.S. PATENT DOCUMENTS

| | | | |
|---|---|---|---|
| 392,385 | 11/1888 | Weston | 335/299 |
| 978,119 | 12/1910 | Eastwood | 335/299 |
| 2,336,834 | 12/1943 | Bakke | 336/222 X |
| 2,439,827 | 4/1948 | Sterenbuch et al. | 336/222 X |
| 2,542,733 | 2/1951 | Tritle et al. | 335/299 |
| 2,592,802 | 4/1952 | Harrold | 336/222 X |
| 3,124,726 | 3/1964 | Howland | 335/282 |
| 3,309,638 | 3/1967 | Rausch et al. | 335/299 |
| 3,549,825 | 12/1970 | Trimble | 335/282 X |
| 4,509,109 | 4/1985 | Hansen | 335/282 X |

Primary Examiner—Mark Hellner
Attorney, Agent, or Firm—Miguel A. Valdes; Henry P. Sartorio; William R. Moser

[57] ABSTRACT

An electrically operated magnetic switch is disclosed herein for use in opening and closing a circuit between two terminals depending upon the voltage across these terminals. The switch so disclosed is comprised of a ferrite core in the shape of a toroid having opposing ends and opposite inner and outer sides and an arrangement of electrically conductive components defining at least one current flow path which makes a number of turns around the core. This arrangement of components includes a first plurality of electrically conducive rigid rods parallel with and located outside the outer side of the core and a second plurality of electrically conductive rigid rods parallel with and located inside the inner side of the core. The arrangement also includes means for electrically connecting these rods together so that the define the current flow path. In one embodiment, this latter means uses rigid cross-tab means. In another, preferred embodiment, printed circuits on rigid dielectric substrates located on opposite ends of the core are utilized to interconnect the rods together.

7 Claims, 3 Drawing Sheets

ELECTRICALLY OPERATED MAGNETIC SWITCH DESIGNED TO DISPLAY REDUCED LEAKAGE INDUCTANCE

The United States Government has rights in this invention pursuant to contract number W-7405-ENG-48 between the United States Department of Energy and the University of California for the operation of the Lawrence Livermore National Laboratory.

FIELD OF THE INVENTION

Background of the Invention

The present invention relates generally to magnetic switches and more particularly to a magnetic switch designed to minimize leakage inductance.

The type of electrical switch to which the present invention is directed is illustrated in FIG. 1 as part of an over-all circuit generally indicated by the reference numeral 10. The switch, indicated at $S_2$, is a two terminal magnetic switch which either conducts current or does not depending upon the voltage across its terminals. In the particular circuit illustrated the magnetic switch $S_2$ is connected between terminals A and B. The rest of the circuit includes the on/off switch $S_1$, inductor L and capacitor $C_1$ and $C_2$ connected in circuit with switch $S_2$ in the manner shown.

The inductor L and the capacitors $C_1$ and $C_2$ are selected so that the switch $S_2$ operates in the following manner. With the on/off switch $S_1$ in the normally opened position illustrated in FIG. 1, the capacitor $C_1$ is charged to a predetermined level. No voltage appears at either point A or point B on opposite sides of the magnetic switch. Once the on/off switch $S_1$ is closed the capacitor $C_1$ discharges into the capacitor $C_2$, causing the voltage at point A to increase from the time $T_0$ (when $S_1$ is closed) to time $T_1$, sufficient to cause the switch $S_2$ to turn on. The voltage at point A increases in accordance with the curve 12 which depends upon the parameters of the inductor L and the capacitors $C_1$ and $C_2$. FIG. 2B illustrates the inductance of the switch between $T_0$ and $T_1$ and thereafter. Note that the inductance is a high inductance between $T_0$ and $T_1$ such that the switch acts as an open circuit and at the time $T_1$ the inductance goes to a low inductance, thereby causing the switch to act as a closed circuit.

The over-all circuit arrangement 10 including specifically magnetic switch $S_2$ and its associated circuitry as described above is a known type of arrangement in the prior art. It has found that such an arrangement is especially suitable as a high speed switch for use in the switching circuitry of a pulsed copper vapor laser.

One reason why the typical magnetic switch just described tends to display a relative large amount of leakage inductance may be best explained with reference to FIGS. 3–5. FIG. 3 illustrates a typical prior art type of magnetic switch 10' which is shown including a toroidal shaped core of ferro magnetic material indicated generally at 12'. A winding 14' of predetermined turns is provided around the core between the terminals A' and B'. A similar switch 10" is illustrated in FIGS. 4 and 5 at 10". This switch includes a toroidal shaped core 12" consisting of a plurality of stacked toroidal shaped ferro magnetic sub cores 12"A. A number of two turn windings 14" are provided around this core in spaced relationship to one another between terminals A" and B". It should be noted that in both embodiments 10' and 10", the windings do not fit tightly against their respective cores. In the case of switch 10", a relatively large space 16" is present between the core and its winding and in the case of switch 10" a relatively large space 16" is present between the core and its windings. These relatively large spaces result in flux leakage which, in turn, results in the leakage inductance discussed above. In order to minimize and hopefully entirely eliminate such leakage, it is necessary to minimize and, if possible, entirely eliminate the spaces 16' and 16". The most ideal situation is where the windings are as close to the core as possible so as to place the flux resulting from current passing through the winding entirely within the core.

SUMMARY OF THE INVENTION

In view of the foregoing, a primary object of the present invention is to provide an electrically operated magnetic switch which is designed from a structural standpoint so as to reduce the spacing between its core and winding or windings and thereby reduce flux leakage and associated leakage inductance during operation of the switch.

A more specific object of the present invention is to achieve the last mentioned object in an uncomplicated and yet reliable way.

Another specific object of the present invention is to add structural integrity to the over-all switch by the same means which achieves the last mentioned objects.

As will be described in more detail hereinafter, the electrically operated magnetic switch designed in accordance with three of the embodiments disclosed herein is one which includes a ferrite core of particular configuration and means defining least one flow path of particular configuration making at least one turn around the core. In accordance with the present invention, this current flow path defining means includes at least one electrically conductive rigid rod on each of opposite sides of the core and means for electrically connecting the rods together so that they form part of the path. In accordance with a first embodiment, the means for connecting the rods together includes rigid, electrically conductive cross-tab means. In accordance with another embodiment, the means for connecting the rods together includes printed circuit means, In both of these embodiments, by utilizing one or more rigid rods on opposite sides of the core, the current path can be physically positioned relatively close to the core itself so as to minimize any spacing between the core and current path, thereby minimizing flux leakage and leakage inductance during operation of the switch. The embodiment including printed circuit means for connecting the rod or rods together is most preferred since the printed circuit means practically eliminates any spacing between the ends of the core and the current path or paths. At the same time, the printed circuit means forms part of an over-all printed circuit board at each end of the core and these printed circuit boards serve to add structural integrity to the over-all switch, as will be seen hereinafter.

Additional objects, advantages and novel features of the invention will be set forth in the description which follows, and in part will become apparent to those skilled in the art upon examination of the following or may be learned by practice of the invention. The objects and advantages of the invention may be realize and attained by means of the instrumentalities and combinations particularly pointed out in the appended claims.

BRIEF DESCRIPTION OF THE DRAWINGS

The over-all electrically operated magnetic switch discussed briefly above and its method of operation will be described in more detail hereinafter in conjunction with the drawings wherein.

DETAILED DESCRIPTION OF THE INVENTION

Reference will now be made in detail to preferred embodiments of the invention, examples of which are illustrated in the accompanying drawings. While the invention will be described in connection with these preferred embodiments, it will be understood that it is not intended to limit the invention to those embodiments. On the contrary, it is to intended to cover all alternatives, modifications and equivalents as way be included within the spirit and scope of the invention as defined by the appended claims.

Figure 1:
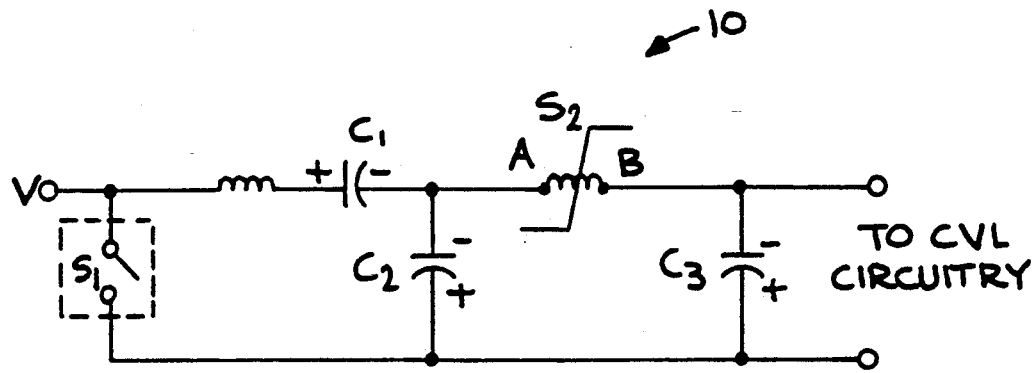
FIG. 1 is a schematic illustration of circuitry including a magnetic switch for operating the latter in the manner described previously.
Figure 2A:
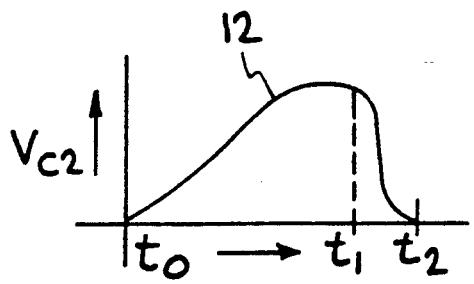
FIGS. 2A and 2B graphically illustrate operational features of circuitry illustrated in FIG. 1, as described previously.
Figure 2B:
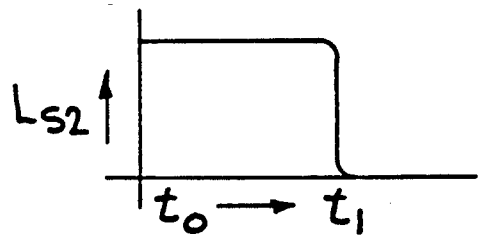
Figure 3:
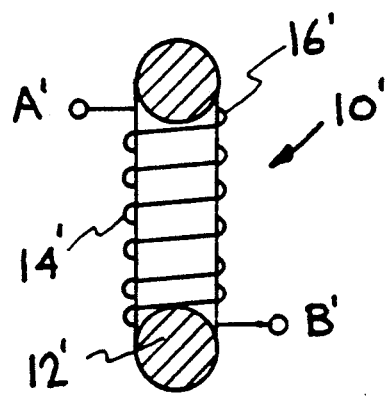
FIG. 3 is a cross-sectional view illustrating the physical structure of an electrically operated magnetic switch designed in accordance with one embodiment in the prior art.
Figure 4:
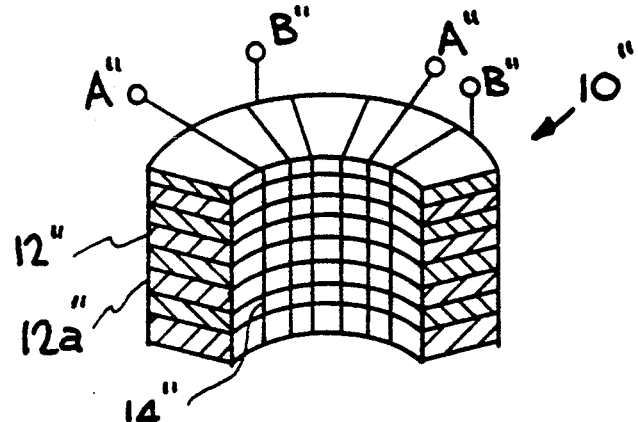
FIG. 4 is a broken away perspective view of a part of an electrically operated magnetic switch designed in accordance with a second embodiment in the prior art.
Figure 5:
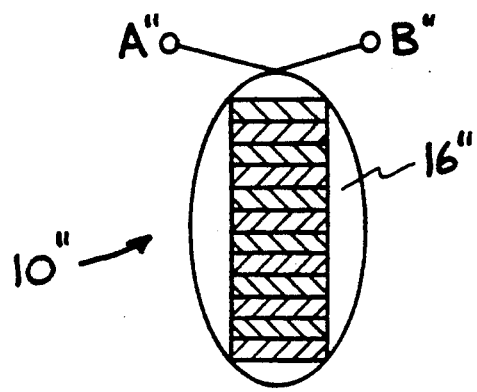
FIG. 5 cross-sectional view of the switch of FIG. 4.
Figure 6:
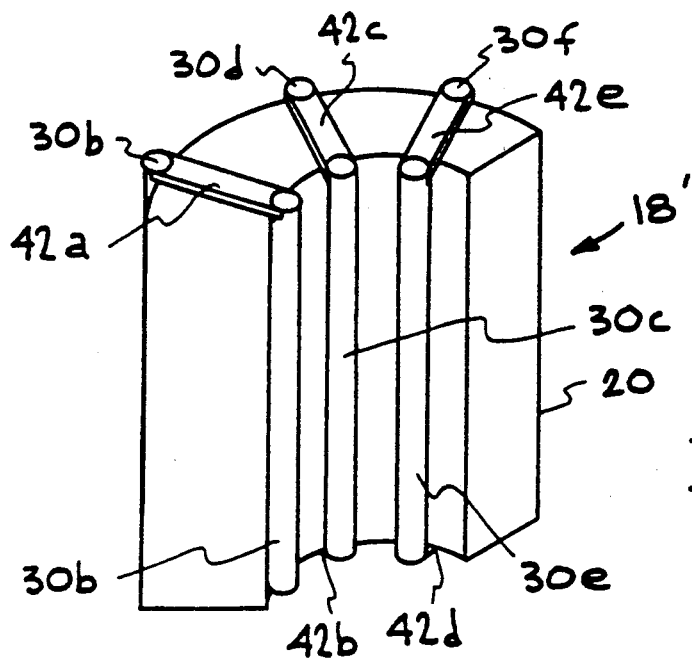
FIG. 6 partially broken away perspective view of an electrically operated magnetic switch designed in accordance with a first embodiment of the present invention.
Figure 8:
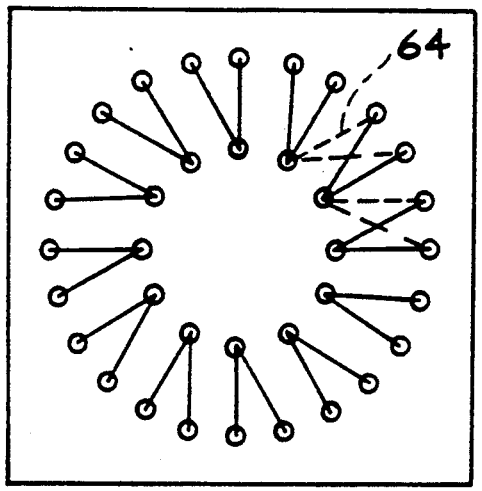
FIG. 8 a plan view of one end of the switch of FIG. 7.
Figure 9:
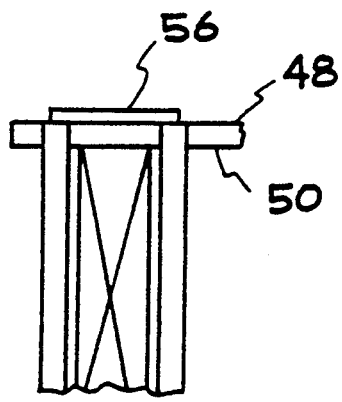
FIG. 9 illustrates a detailed aspect of the switch of FIG. 7.
Figure 7:
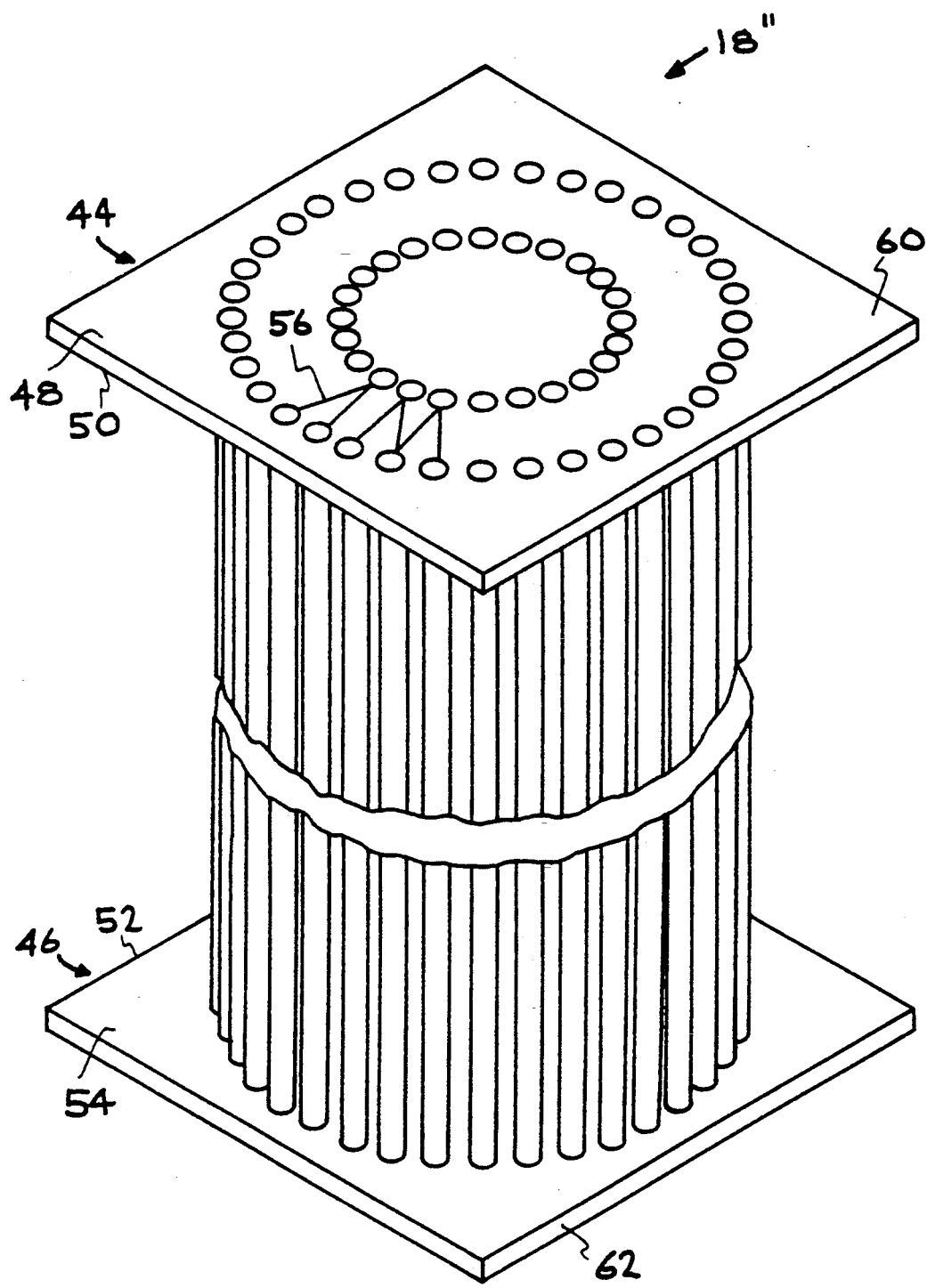
FIG. 7 a partially broken away perspective view of an electrically operated magnetic switch designed in accordance with another, preferred embodiment of the present invention.

Turning now to the drawings, attention is immediately directed to FIGS. 6-9 since FIGS. 1-5 were discussed previously. As indicated above, FIG. 6 is directed to an electrically operated magnetic switch designed in accordance with one embodiment of the present invention while FIGS. 7-9 are directed to a switch designed in accordance with a preferred embodiment. In view of the foregoing discussions, it should be apparent that the present invention relates to structural aspects of each switch and not the way in which the switch functions electrically. The electrical operation of each switch illustrated in FIGS. 6-9 is the same as switch $S_2$ in FIG. 1, except that leakage inductance is minimized and therefore each switch designed in accordance with the present invention more reliably follows the curves illustrated in FIGS. 2A and 2B than the switches of FIGS. 3-5. Therefore, the electrical operation of the switches illustrated in FIGS. 6-9 will not be discussed herein.

In FIG. 6, an electrically operated magnetic switch 18' is illustrated in part. This switch includes the a toroidal, ferromagnetic core 20 and an arrangement of rigid, electrically conductive rods 30. The rods 30 forming part of switch 18' are interconnected at their ends by means of electrically conductive cross-tabs 42. As specifically illustrated in FIG. 6, the rods 30a and 30b are interconnected at their top ends by means of cross-tab 42a. The bottom ends of rods 30b and 30c are interconnected by cross-tab 42b, and so on such that the combination of rods 30a–30f and tabs 42a–42e serve as a continuous winding of three turns around the core. The combination rods/tabs could provide a greater or lesser number of turns or could provide groups of discontinuous turns around the core.

Having described switches 18', attention is now directed to FIGS. 7-9 which together illustrate a third electrically operated magnetic switch 18" which is designed in accordance with a preferred embodiment of the present invention. Switch 18" includes the same core 20 and electrically conductive rods 30 as switch 18'. However, the ends of the rods are not interconnected by means of cross-tabs. Rather, as will be discussed in more detail below, both the top ends and the bottom ends of the rods are connected electrically (in a predetermined way) and also mechanically by means of circuit boards 44 an 46.

The circuit board 44 includes a relatively rigid dielectric substrate 48 having an underside 50 positioned against the top end surface 28 of core 20 and is sufficiently large to extend well beyond the outer and inner sides 22 and 24 of the core, as belt illustrated in FIGS. 7 and 8. Through holes are provided in the substrate for receiving top end sections of associated rods 30. Two such through holes are illustrated in FIG. 9. Each through hole may be designed to receive its associated rod in a tight fitting fashion; the hole and rod could be cooperatively threaded; the rod could be bonded into the hole; suitable bolts could be used; or any other such means could be readily provided for insuring a rigid connection between each rod and its associated hole. This provides a strong mechanical connection between the top ends of all the rods and substrate 48. The circuit board 46 includes a similar substrate 52 having a top side 54 disposed against the bottom end 26 of core 20 and includes cooperating through holes which receive bottom end sections of the rods in the same manner as the through holes provided in substrate 48. Thus, the two substrates 48 and 52 serve to reliably support the rods 30 in position against opposite sides of core 20 and the substrates and rods together form a relatively strong and rigid structure.

Thus far it has been shown how the rods 30 are interconnected structurally by means of substrates 48 and 52. Circuit board 44 also includes individual printed circuits 56 formed on its top side 60. These printed circuits extend between the various through holes in substrate 48 in a predesigned way so as to electrically interconnect the top ends of predetermined rods 30 with one another. One such printed circuit is illustrated in FIG. 10 interconnecting together two rods located on opposite sides of the core. While not shown, except in dotted lines (and only partially so), the underside 62 of substrate 52 also includes printed circuits for electrically interconnecting the bottom ends of predetermined rods 30. Four such printed circuits are shown by dotted lines in FIG. 8 at 64.

The printed circuits 56 and 64 are predesigned on their respective substrates 48 and 52 so as to interconnect the various rods 30 in a way which will provide the desired current flow path or paths around core 20. Thus, the printed circuits could be designed to provide a single continuous winding of a plurality of turns or discontinuous windings, each having its own predetermined number of turns. In the particular embodiment illustrated, the printed circuits 56 and 64 electrically interconnect the rods so as to provide a single continuous winding of a plurality of turns. However, it should be apparent from FIGS. 8 and 9 that each rod located within the core is electrically interconnected with two rods located outside the core. This is because the switch 18" has been provided with twice as many outer rods than inner rods since the circumference of outer side 20 is approximately twice the circumference of inner side 22. As a result, each turn forming part of the over-all current flow path around core 20 includes a two rod section (the outer section) and a single rod section (the inner section). In this way, the current density at any given point on the outside of the core can be made equal or approximately equal to the current density at any given point inside the core, thereby providing a high quality switch.

From the foregoing description of switch 18" it should be apparent that the printed circuit boards 44 and 46 serve both a mechanical and electrical function in interconnecting rods 30 to one another. In addition, while the embodiment illustrated in FIGS. 8-10 show pairs of outer rods interconnected with single inner rods, it should be apparent that any type of imbalanced configuration can be readily provided, as contrasted with the single outer and inner rod configurations of FIG. 6. The imbalance will depend upon the configuration of the core itself and how many rods are required around its outside surface as compared to the rods required inside the core. The idea is to make the current density as uniform as possible on both sides. Of course a primary advantage to using circuit boards resides in the fact that the spacing between the printed circuits and the ends of the core can be reduced to the thicknesses of the substrates 48 and 52 and therefore practically eliminated.

The foregoing, description of the preferred embodiments of the invention have been presented for purposes of illustration and description. It is not intended to be exhaustive or to limit the invention to the precise form disclosed, and obviously many modifications and variations are possible in light of the above teaching. The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended thereto.

What is claimed is:

1. Am electrically operated magnetic switch, comprising a ferrite core of particular configuration and means defining at least one current flow path of particular configuration making at least one turn around said core, said switch providing alternatively opened and closed circuits between cooperating first and second terminals depending upon the voltage across said terminals, said current flow path defining means including at least one electrically conductive rigid rod on each of opposite sides of said core and means for electrically connecting said rods together so as to form said path, said core being in the shape of a toroid having opposite inner and outer sides serving as said opposite sides and said current flow path defining means including a greater number of said conductive rods on the outer side of said toroidal shaped core than on the inner side thereof.

2. A magnetic switch according to claim 1 wherein said means for connecting said rods together includes rigid cross-tab means.

3. An electrically operated magnetic switch adapted for connection between first and second terminals whereby to provide alternatively an open circuit or a closed circuit between said terminals depending upon the voltage across the latter, said switch comprising: a ferrite core in the shape of a toroid having opposite inner and outer sides; and means defining at least one current flow path making a plurality of turns around a section of said core including said opposite sides, said current flow path defining means including a first plurality of electrically conductive rigid rods parallel with and outside the outer side of the toroidal shaped core, a second plurality of electrically conductive rigid rods parallel with and on the inside of the inner surface of the toroidal shaped core, and rigid cross-tab means means for electrically connecting said rods together so that they form said current flow path, said first plurality of electrically conductive rigid rods including a greater number of rods than said second plurality of rods and said cross-tab means interconnecting the rods to one another to define said flow path such that at least some of the sections of said flow path outside the core include parallel connected rods.

4. An electrically operated magnetic switch adapted for connection between first and second terminals whereby to provide alternatively an open circuit or a closed circuit between said terminals depending upon the voltage across the latter, said switch comprising: a ferrite core in the shape of a toroid having opposite inner and outer sides; and means defining at least one current flow path making a plurality of turns around a section of said core including said opposite sides, said current flow path defining means including a first plurality of electrically conductive rigid rods parallel with and outside the outer side of the toroidal shaped core, a second plurality of electrically conductive rigid rods parallel with and on the inside of the inner surface of the toroidal shaped core, and means for electrically connecting said rods together so that they form said current flow path, said means for electrically connecting said rods together including printed circuit means located at each end of the toroidal shaped core.

5. A magnetic switch according to claim 4 wherein each of said printed circuit means includes printed circuits on a rigid dielectric substrate, said substrates being fixedly connected to opposite ends of said rods on opposite ends of said toroidal shaped core whereby to serve to structurally hold said rods in position on opposite sides of said core.

6. A magnetic switch according to claim 5 wherein said first plurality of rods includes a greater number of rods than said second plurality thereof and wherein all of said printed circuits electrically connect said rods together such that at least some of the sections of the current flow path defined by said rods and printed circuits include parallel connected rods.

7. An electrically operated magnetic switch, comprising a ferrite core of particular configuration and means defining at least one current flow path of particular configuration making at least one turn around said core, said switch providing alternatively opened and closed circuits between cooperating first and second terminals depending upon the voltage across said terminals, said current flow path defining means including at least one electrically conductive rigid rod on each of opposite sides of said core and means for electrically connecting said rods together so as to form said path, said means for connecting said rods together including printed circuit means.

* * * * *